United States Patent
Sutardja (10) Patent No.: US 7,988,744 B1
(45) Date of Patent: Aug. 2, 2011

(54) METHOD OF PRODUCING CAPACITOR STRUCTURE IN A SEMICONDUCTOR DEVICE

(75) Inventor: Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 16 days.

(21) Appl. No.: 12/536,237

(22) Filed: Aug. 5, 2009

Related U.S. Application Data (60) Division of application No. 11/474,246, filed on Jun. 23, 2006, now Pat. No. 7,578,858, which is a division of application No. 11/179,133, filed on Jul. 11, 2005, now Pat. No. 7,116,544, which is a continuation of application No. 10/870,579, filed on Jun. 16, 2004, now Pat. No. 6,980,414.

(51) Int. Cl.
*H04R 17/00* (2006.01)
*H01G 9/00* (2006.01)

(52) U.S. Cl. .............. 29/25.03; 29/25.41; 29/25.42; 361/311; 361/306.2; 438/106

(58) Field of Classification Search ............ 29/25.03, 29/25.35–25.42, 830–832; 361/306.3, 311–313, 361/321.2, 309, 328–330; 257/295, 532; 438/106, 111, 123
See application file for complete search history.

(56) References Cited

U.S. PATENT DOCUMENTS

| | | | |
|---|---|---|---|
| 3,034,445 A | 5/1962 | Pelladeau | |
| 3,255,324 A | 6/1966 | Ovshinsky | |
| 3,460,010 A | 8/1969 | Domenico et al. | |
| 4,017,820 A | 4/1977 | Ross | |
| 4,409,608 A | 10/1983 | Yoder | |
| 4,419,713 A | 12/1983 | Levinson | |
| 4,423,371 A | 12/1983 | Senturia et al. | |
| 4,481,487 A | 11/1984 | Brelm et al. | |
| 4,890,192 A | 12/1989 | Smith | |
| 4,929,998 A | 5/1990 | Boudewijns | |
| 4,937,649 A | 6/1990 | Shiba | |
| 4,949,217 A | 8/1990 | Ngo | |
| 4,972,252 A | 11/1990 | Maekawa | |
| 5,053,351 A | 10/1991 | Fazan et al. | |

(Continued)

FOREIGN PATENT DOCUMENTS

DE 76 35 588 2/1978

(Continued)

OTHER PUBLICATIONS (Non-English Translation), Toshio Sudo, "*Interconnect Capacitances and Crosstalk Noices on GaAs LSI's*", R&D Center, Toshiba Corp.

(Continued)

*Primary Examiner* — Minh Trinh (57) ABSTRACT

A method of producing capacitor structure includes, in at least one aspect, arranging first layer, adjacent first and second polarity conducting strips, the first layer conducting strips arranged as respective piecewise "S" shaped paths; arranging second layer, adjacent first and second polarity conducting strips, the second layer conducting strips arranged as respective piecewise "S" shaped paths, the second layer second polarity conducting strip is arranged overlying and electrically separated from the first layer first polarity conducting strip, and the second layer first polarity conducting strip is arranged overlying and electrically separated from the first layer second polarity conducting strip; electrically connecting the first layer first polarity conducting strip with the second layer first polarity conducting strip; and electrically connecting the first layer second polarity conducting strip with the second layer second polarity conducting strip.

6 Claims, 9 Drawing Sheets

U.S. PATENT DOCUMENTS

| | | | |
|---|---|---|---|
| 5,172,299 A | 12/1992 | Yamada et al. | |
| 5,208,725 A | 5/1993 | Akcasu | |
| 5,245,505 A | 9/1993 | Shiga et al. | |
| 5,583,359 A | 12/1996 | Ng et al. | |
| 5,903,493 A | 5/1999 | Lee | |
| 6,001,702 A | 12/1999 | Cook et al. | |
| 6,124,624 A | 9/2000 | Van Roosmalen et al. | |
| 6,150,707 A | 11/2000 | Cook et al. | |
| 6,266,226 B1 | 7/2001 | Hayashi | |
| 6,266,227 B1 | 7/2001 | Konushi et al. | |
| 6,312,963 B1 | 11/2001 | Chou et al. | |
| 6,414,806 B1 | 7/2002 | Gowda et al. | |
| 6,445,056 B2 | 9/2002 | Nakashima | |
| 6,459,561 B1 | 10/2002 | Galvagni et al. | |
| 6,501,610 B1 | 12/2002 | Sugawara et al. | |
| 6,570,210 B1 | 5/2003 | Sowlati et al. | |
| 6,597,562 B1 | 7/2003 | Hu et al. | |
| 6,635,916 B2 | 10/2003 | Aton | |
| 6,815,739 B2 | 11/2004 | Huff et al. | |
| 6,980,414 B1 | 12/2005 | Sutardja | |
| 7,116,544 B1 * | 10/2006 | Sutardja | 361/306.3 |
| 7,327,551 B2 | 2/2008 | Chien et al. | |
| 7,578,858 B1 * | 8/2009 | Sutardja | 29/25.03 |

FOREIGN PATENT DOCUMENTS

| | | |
|---|---|---|
| DE | 41 13 576 A1 | 10/1991 |
| GB | 995334 | 6/1965 |
| GB | 1 247 985 | 9/1971 |
| GB | 2 060 253 A | 4/1981 |
| JP | 42-5946 | 3/1942 |
| JP | 52-122674 | 3/1951 |
| JP | 52-122675 | 3/1951 |
| JP | 56-16936 | 7/1954 |
| JP | 56-96620 | 12/1954 |
| JP | 57-157128 | 3/1956 |
| JP | 57-157129 | 3/1956 |
| JP | 57-215803 | 1/1962 |
| JP | 46-24658 | 7/1971 |
| JP | 46-43172 | 12/1971 |
| JP | 50-42369 | 4/1975 |
| JP | 53-61051 | 6/1978 |
| JP | 54-101153 | 8/1979 |
| JP | 57-52120 | 3/1982 |
| JP | 52-051552 | 3/1983 |
| JP | 58-051552 | 3/1983 |
| JP | 58-56432 | 4/1983 |
| JP | 58-66632 | 5/1983 |
| JP | 58-097854 | 6/1983 |
| JP | 58-159367 | 9/1983 |
| JP | 59-91718 | 6/1984 |
| JP | 59-105341 | 6/1984 |
| JP | 59-105341 A | 6/1984 |
| JP | 59-132613 | 7/1984 |
| JP | 59-197122 | 11/1984 |
| JP | 59-222959 | 12/1984 |
| JP | 222959 | 12/1984 |
| JP | 60-1825 | 1/1985 |
| JP | 60-4207 | 1/1985 |
| JP | 60-92604 | 5/1985 |
| JP | 60-102725 | 6/1985 |
| JP | 60-102726 | 6/1985 |
| JP | 60-102727 | 6/1985 |
| JP | 61-55936 | 3/1986 |
| JP | 61-57513 | 4/1986 |
| JP | 61-259560 A | 11/1986 |
| JP | 61-263251 | 11/1986 |
| JP | 64-084616 | 3/1989 |
| JP | 01-096943 A | 4/1989 |
| JP | 01-120858 A | 5/1989 |
| JP | 01-133354 | 5/1989 |
| JP | 2-47024 | 3/1990 |
| JP | 02-086160 A | 3/1990 |
| JP | 02-090561 A | 3/1990 |
| JP | 03-257855 A | 3/1990 |
| JP | 02-178963 A | 7/1990 |
| JP | 02-191369 A | 7/1990 |
| JP | 03-096267 A | 4/1991 |
| JP | 03-133169 A | 6/1991 |
| JP | 3-79416 | 8/1991 |
| JP | 03-181165 A | 8/1991 |

OTHER PUBLICATIONS

"Conference Proceedings of the 14th European Microwave Conference," Sep. 1984, SITEL—The SociétéBelge Des Ingénieurs De Télécommunications Et D' Electronique, pp. 853-858.

"Gallium Arsenide Processing Techniques," 1984.

"Gallium Arsenide," Jan. 1988, Colloquium Digest No: 1988/17.

"Micro Electro Mechanical Systems," Feb. 1989, IEEE Catalog No. 89THO249-3.

"Microwave Theory and Techniques," Apr. 1978, IEEE Trans. Microwave Theory Tech., vol. MTT-26, No. 4.

"Monolithic Circuits Symposium," Jun. 1991, IEEE Catalog No. 91CH3016-3.

"Switched Capacitor-Filler Dynamic Tuning Mechanism", Feb. 1987, No. 274, Kenneth Mason Publications, Ltd., London, England.

"Technology Growth for the 80's," May 1980, IEEE Catalog No. 80CH1545-3 MTT.

Alley, G., "Interdigital Capacitors and Their Application to Lumped-Element Microwave Integrated Circuits," Dec. 1970, IEEE Trans. Microwave Theory Tech., vol. MTT-18, No. 12.

Aparicio, R., and Hajimiri A., "Capacity Limits and Matching Properties of Lateral Flux Integrated Capacitors," 2001, Pasadena, California, Department of Electrical Engineering, California Institute of Technology.

Benecke W., Petzold, H.-C., "Micro Electro Mechanical Systems," Feb. 1992, IEEE Catalog No. 92CH3093-2.

Benedek, P., "Capacitances of a planar multiconductor configuration on a dielectric substrate by a mixed order finite-element method," May 1976, IEEE Trans. Circuits and Systems, vol. 23, No. 5, pp. 279-284.

Ch'en, D. et al., "Devices & Monolithic Circuit Elements" 1984, IEEE MTT-S Digest.

Chan, C., "Analysis of MMIC Structures Using an Efficient Iterative Approach," Jan. 1983, IEEE Trans. Microwave Theory Tech., vol. 36, No. 1.

Cohen, S., "A Novel Metal-Insulator-Metal Structure for Field-Programmable Devices," Jul. 1998, IEEE Trans. Electron Devices, vol. 40, No. 7.

Delrue, R. et al., "The Effects of a Dielectric Capacitor Layer and Metallization on the Propagation Parameters of Coplanar Waveguide for MMIC," Aug. 1988, IEEE Trans. Microwave Theory Tech., vol. 36, No. 8.

Esfandiari, R. et al., "Design of Interdigitated Capacitors and their Application to Gallium Arsenide Monolithic Filters," Jan. 1983, IEEE Trans. Microwave Theory Tech., vol. 31, No. 1.

G.D. Alley, "Interdigital Capacitors for Use in Lumped-Element Microwave Integrated Circuits", May 1970, vol. 70, Issue 1, IEEE Xplore.

G.L. Matthael, "Interdigital Band-Pass Filters", Nov. 1962, vol. 10, Issue 6, IEEE Xplore.

IEEE Transactions, "Microwave Theory and Techniques", vol. 38, No. 12, Dec. 1990, Publication of the IEEE Microwave Theory and Techniques Society.

IEEE Transactions, "Microwave Theory and Techniques", vol. MTT 31, No. 1, Jan. 1983, Publication of the IEEE Microwave Theory and Techniques Society.

Ingo Wolff et al. "Computerized Microwave Circuit Layout and Mask Generation, Computer Models for MMIC Capacitors and Inductors", 14th European Microwave Conference, Sep. 1984.

Kollipara, R. et al., Modeling and Design of Interdigital Structure, Nov. 1991, IEEE Trans. Electron Devices, vol. 38, No. 11.

Lin, J., Two dimensional and three-dimensional interdigital capacitors as basic elements for chemical sensors, 1991, Sensors and Actuators B, 5, pp. 223-226.

Naghed, M. et al., Equivalent Capacitances of Coplanar Waveguide Discontinuities and Interdigitated Capacitors Using a Three-Dimensional Finite Difference Method, Dec. 1990, IEEE Trans. Microwave Theory Tech., vol. 38, No. 12.

P. Benedek and P. Silvester, "*Capacitance of Parallel Rectangular Plates Separated by a Dielectric Sheet*", Aug. 1972, vol. 20, Issue 8, IBM Technical Disclosure Bulletin.

S.T. Nguyen and T. Proch, "*Vertical Capacitor VLSI Structure for High Voltage Applications*", Dec. 1989, vol. 32, No. 7 IBM Technical Disclosure Bulletin.

Sato, S., et al., "*An $SIO_2$ -$Ta_2O_5$ Thin Film Capacitor*," Sep. 1973, IEEE Trans. Parts, Hybrids, Packaging, vol. PHP-9, No. 3.

Slater, D., "*Low-Voltage Coefficient Capacitors for VLSI Processes*," Feb. 1989, IEEE Journal of Solid-State Circuits, vol. 24, No. 1.

Tanaka, H., *The Effect of Surface Roughness of $Si_3N$ Films on TDDB Characteristics of Ono Films,* 1992, IEEE/IRPS, pp. 31-36.

Tetsushi Sakai et al., "*Elevated Electrode Integrated Circuits*", vol. SC-14, No. 2, Apr. 1979, IEEE Journal of Solid State Circuits.

Thomas & Delphion, "*Electrostatic Device*", Sep. 1963, IBM Technical Disclosure Bulletin.

Van Den Berg, P., et al., *The Electric-Field Problem of an Interdigital Transducer in a Multilayered Structure*, Feb. 1985, IEEE Trans. Microwave Theory Tech., vol. MTT-33, No. 2.

Veloric, H., et al., *Capacitors for Microwave Applications,* Jun. 1976, IEEE Trans. Parts, Hybrids, Packaging, vol. PHP-12, No. 2.

Wakayama, M., et al., "*A 30-MH Low-Jitter High-Linearity CMOS Voltage-Controlled Oscillator,*" Dec. 1987, IEEE Journal of Solid-State Circuits, vol. SC-22, No. 6.

X.Y. Che and Y.L. Chow, "*Microwaves, Antennas and Propagation*", vol. 33 Part H, No. 3, Jun. 1986, IEE Proceedings-H.

\* cited by examiner

METHOD OF PRODUCING CAPACITOR STRUCTURE IN A SEMICONDUCTOR DEVICE

CROSS-REFERENCE TO RELATED APPLICATIONS

This application is a divisional application (and claims the benefit of priority under 35 USC 120) of U.S. application Ser. No. 11/474,246, filed Jun. 23, 2006, now U.S. Pat. No. 7,578, 858, which is a divisional application of (and claims the benefit of priority under 35 USC 120) of U.S. application Ser. No. 11/179,133, filed Jul. 11, 2005, now U.S. Pat. No. 7,116, 544, which is a continuation application (and claims the benefit of priority under 35 USC 120) of U.S. application Ser. No. 10/870,579, filed Jun. 16, 2004, now U.S. Pat. No. 6,980,414. The disclosure of the prior applications is considered part of (and is incorporated by reference in) the disclosure of this application. This application is related to commonly owned, copending U.S. application Ser. No. 10/601,286, filed Jun. 20, 2003, which is a continuation of U.S. application Ser. No. 09/765,200, filed Jan. 18, 2001, now U.S. Pat. No. 6,625,006, the entire contents of which are incorporated by reference herein.

The present application is also related to commonly owned, copending U.S. application Ser. No. 10/372,617, filed on Feb. 21, 2003 (which is a divisional of the '006 patent), the entire contents of which are incorporated by reference herein.

BACKGROUND

The following disclosure relates to semiconductor devices.

In integrated circuit design there are many applications that include high performance, on-chip capacitors. These applications include, for example, voltage control oscillators, phase-lock loops, operational amplifiers, and switching capacitors. On-chip capacitors can be used, e.g., to isolate digital and analog integrated circuits from noise created within an integrated circuit system or to store charge within an integrated circuit system.

Figure 1:
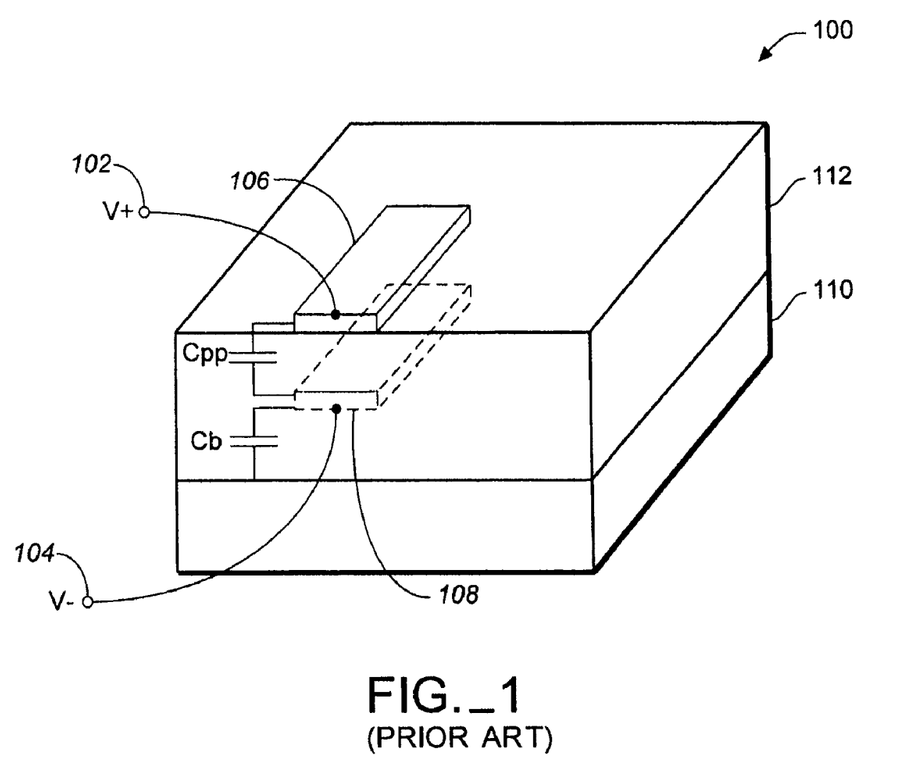
FIG. 1 illustrates a conventional on-chip capacitor structure.

Conventional on-chip capacitors can be configured as Metal-Oxide-Metal capacitors (MOMs). Referring to FIG. 1, the construction of a conventional MOM capacitor 100 is illustrated. MOM capacitor 100 includes two nodes 102 and 104 that are formed on conductor layers 106 and 108, respectively. A substrate 110 forms a base for MOM capacitor 100. Conductor layers 106 and 108 are separated by a dielectric 112 (e.g., silicon dioxide). Substrate 110 and conductor layer 108 can also be separated by a dielectric (not shown). In addition to a device (parallel plate) capacitance (Cpp) that is formed between nodes 102 and 104, an undesirable parasitic capacitance (Cs) may also be formed between substrate 110 and node 104 in a conventional MOM structure.

SUMMARY

In general, in one aspect, this specification describes a capacitor structure. The capacitor structure includes a substrate, a first group of conducting strips, a second group of conducting strips, a third group of conducting strips, and a fourth group of conducting strips.

The first group of conducting strips are arranged substantially parallel to each other within a first layer disposed on the substrate. The first group of conducting strips are also connected to a first node and are in electrical communication with each other. The second group of conducting strips are arranged substantially parallel to each other and alternate with the first group of conducting strips within the first layer. The second group of conducting strips are connected to a second node and are in electrical communication with each other. The third group of conducting strips are arranged substantially parallel to each other within a second layer that at least partially overlies the first layer. The third group of conducting strips are in electrical communication with each other and with the first group of conducting strips. The third group of conducting strips are further substantially perpendicular to the first group of conducting strips and the second group of conducting strips. The fourth group of conducting strips are arranged substantially parallel to each other and alternate with the third group of conducting strips within the second layer. The fourth group of conducting strips are in electrical communication with each other and with the second group of conducting strips. The fourth group of conducting strips are further substantially perpendicular to the first group of conducting strips and the second group of conducting strips.

Particular implementations can include one or more of the following. The capacitor structure can further include a dielectric interposed between the first and second layers. The dielectric can be a layer of silicon dioxide. The capacitor structure can further include a guardband spaced from the first and second nodes. The guardband can be comprised of a conductive material—e.g., aluminum, polysilicon, or copper. The guardband can be spaced approximately a predetermined distance (dg) from the first and second nodes, in which adjacent conducting strips of the first and second layers are spaced apart approximately a predetermined distance (dh), and the distance (dg) is selected to be substantially twice the distance (dh). The guardband can be located on a single layer or distributed over multiple layers. The guardband can encircle the first and second layers of conducting strips. At least one of the first, second, third and fourth groups of conducting strips can be connected by a corresponding base strip. The first group of conducting strips can be connected to the third group of conducting strips by vertical vias. The second group of conducting strips can be connected to the fourth group of conducting strips by vertical vias. The second layer can substantially overlie the first layer.

In general, in another aspect, this specification describes a capacitor structure that includes a substrate, a first group of conducting strips, a second group of conducting strips, a third group of conducting strips, a fourth group of conducting strips, a first set of vertical vias, a second set of vertical vias, a third set of vertical vias, and a fourth set of vertical vias.

The first group of conducting strips are arranged substantially parallel to each other within a first layer disposed on the substrate. The first group of conducting strips are connected to a first node and are connected to a first base strip. The second group of conducting strips are arranged substantially parallel to each other and alternate with the first group of conducting strips within the first layer. The second group of conducting strips are connected to a second node and are connected to a second base strip. The third group of conducting strips are arranged substantially parallel to each other within a second layer that at least partially overlies the first layer. The third group of conducting strips are connected to the first node and are connected to a third base strip. The third group of conducting strips are substantially parallel to and substantially overlie the first group of conducting strips. The fourth group of conducting strips are arranged substantially parallel to each other and alternate with the third group of conducting strips within the second layer. The fourth group of conducting strips are connected to the second node and are connected to a fourth base strip. The fourth group of conducting strips are also substantially parallel to and substantially overlie the second group of conducting strips. The first set of vertical vias interconnect the first group of conducting strips to the third group of conducting strips. The second set of vertical vias interconnect the second group of conducting strips to the fourth group of conducting strips. The third set of vertical vias interconnect the first base strip to the third base strip. The fourth set of vertical vias interconnect the second base strip to the fourth base strip.

Particular implementations can include one or more of the following. The third set and fourth set of vertical vias can be each placed at locations along a respective base strip substantially adjacent to vertical vias of an opposite node that are located on one or more of the first, second, third or fourth groups of conducting strips.

Implementations can include one or more of the following advantages. On-chip capacitance structures are provided that are highly immune to noise fluctuations that may be present on a substrate. In addition, the on-chip capacitance structures provide a high capacitance-per-volume. In one implementation, vertical vias are used within a base strip to form base strip via capacitances that further increase the overall capacitance-per-volume of the capacitance structure. On-chip capacitance structures are provided that also have an efficient use of space.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 2:
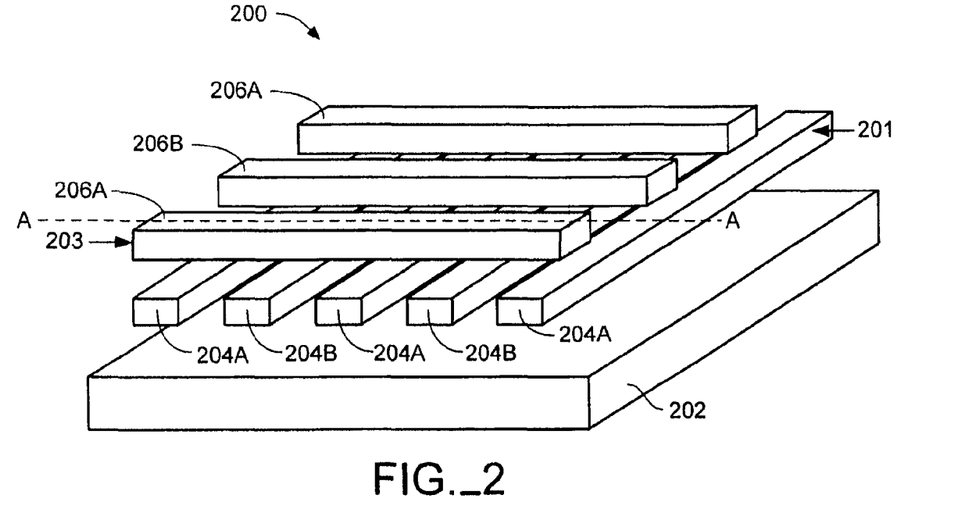
FIG. 2 is a perspective view of an on-chip capacitor structure.

FIG. 2 illustrates one implementation of an on-chip capacitor 200. On-chip capacitor 200 includes two layers 201, 203 of conducting strips formed upon a substrate 202. Substrate 202 can be a p-type substrate or an n-type substrate. A first layer 201 is formed by two sets of conducting strips 204A and 204B. Conducting strips 204A and 204B are arranged alternately and substantially in parallel to each other (i.e., a conducting strip 204A is next to a conducting strip 204B, which, in turn, is located next to a second conducting strip 204A, and so on). A second layer 203 is formed by two sets of conducting strips 206A and 206B. Second layer 203 can be separated from first layer 201 by an insulating layer (not shown). The insulating layer can be a silicon dioxide layer. Second layer 203 at least partially overlies first layer 201—e.g., at least one conducting strip of the second layer overlies at least a portion of a conducting strip in the first layer. Conducting strips 206A and 206B are also arranged alternately and substantially in parallel to each other. In one implementation, conducting strips 206A and 206B overlie and are substantially perpendicular to conducting strips 204A and 204B.

Conducting strips 204A of first layer 201 and conducting strips 206A of second layer 203 are connected to form a first common node. In one implementation, conducting strips 204A and conducting strips 206A are connected by vertical vias. Likewise, conducting strips 204B of first layer 201 and conducting strips 206B of second layer 203 are connected to form a second common node. The first common node and the second common node form opposing nodes of on-chip capacitor 200. Each conducting strip 204A connected to the first common node has one or more overlying conducting strips 206B and one or more overlying conducting strips 206A. Likewise, each conducting strip 204B connected to the second common node has one or more overlying conducting strips 206A and one or more overlying conducting strips 206A. In one implementation, the number of "A" and "B" conducting strips are equal within each layer.

Figure 3:
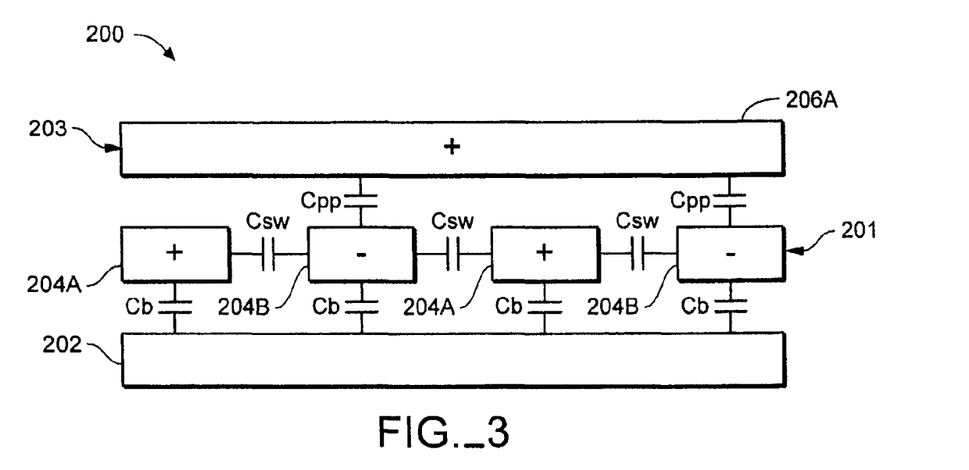
FIG. 3 is a side view of the A-A cross-section of the on-chip capacitor structure in FIG. 2, showing associated capacitances.

FIG. 3. shows a cross-section of on-chip capacitor 200 (FIG. 2). A parallel plate capacitance (Cpp) is present between each conducting strip 204B and conducting strip 206A. Furthermore, a sidewall capacitance (Csw) is present between each adjacent pair of conducting strips (e.g., conducting strips 204A and 204B) within each layer. In addition, a substrate capacitance (Cb) is formed between conducting strips in first layer 201 (e.g., conducting strips 204A and 204B) and substrate 202. As shown in FIG. 3, substrate 202 can be at ground (or a low voltage potential).

Figure 4:
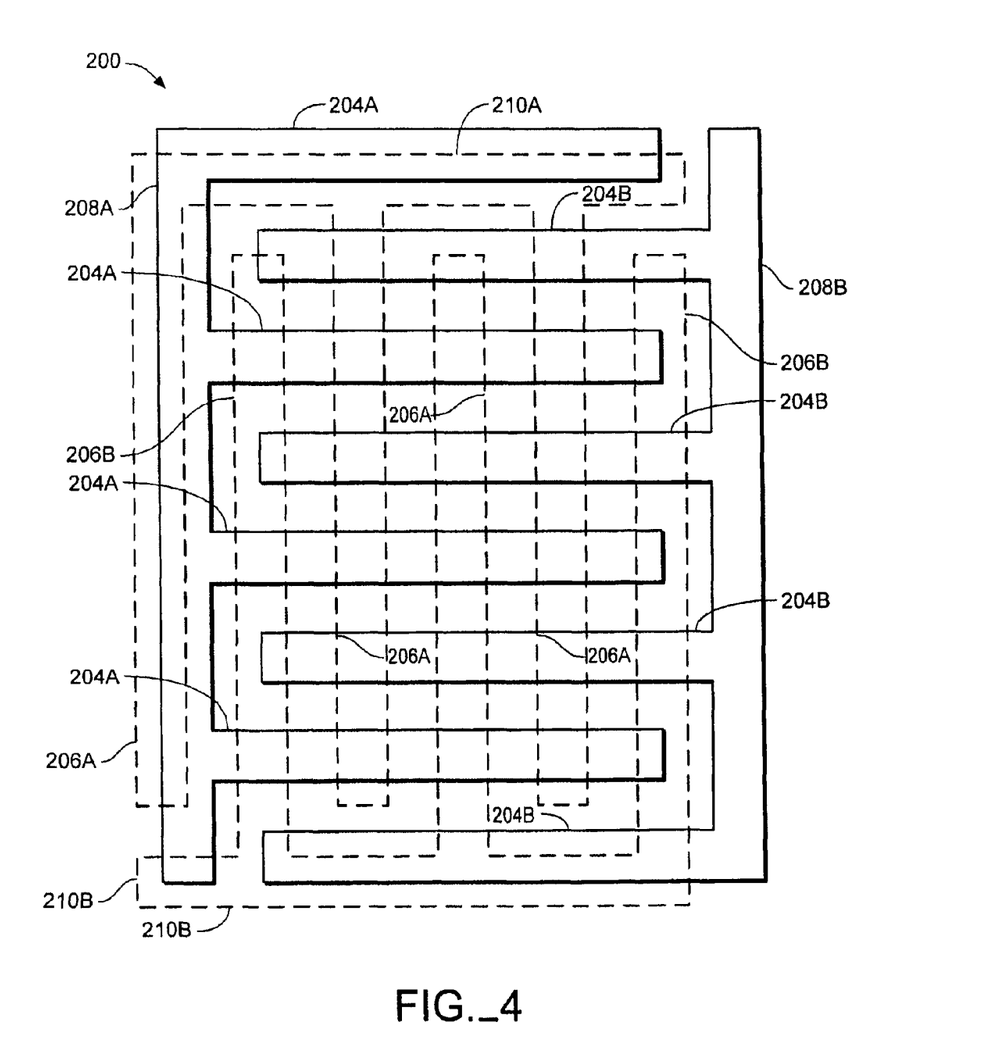
FIG. 4 is a top view of the on-chip capacitor structure of FIG. 2.

FIG. 4 illustrates a top view of how conducting strips 204A and 204B of first (lower) layer 201 and conducting strips 206A and 206B of second (upper) layer 203 are laid out in one implementation. Conducting strips 204A and 204B of the lower layer are shown in solid lines. In one implementation, conducting strips 204A are connected by a base strip 208A and conducting strips 204B are connected by a base strip 208B. Alternatively, each of conducting strips 204A and conducting strips 204B can be respectively connected by vertical vias (not shown). Base strips 208A and 208B are located at opposing ends of conducting strips 204A and 204B so that conducting strips 204A and 204B are interdigitated. In one implementation, base strips 208A and 208B are sized to be narrow—e.g., as wide as conducting strips 204A and 204B—to minimize space occupied by on-chip capacitor 200.

Conducting strips 206A and 206B of the upper layer are shown by dotted lines and are displaced to distinguish the upper layer conducting strips 206A and 206B from the lower layer conducting strips 204A and 204B. In general, conducting strips 206A and 206B substantially lie perpendicularly directly over conducting strips 204A and 2043. In one implementation, conducting strips 206A are connected by a base strip 210A and conducting strips 206B are connected by a base strip 210B. Alternatively, each of conducting strips 206A and conducting strips 2063 can be respectively connected by vertical vias (not shown). As shown in FIG. 4, base strips 210A and 210B are at opposing ends of conducting strips 206A and 206B. In one implementation, the second layer pattern of interdigitated conducting strips 206A and 206B is substantially perpendicular to the first layer pattern.

The interconnections between the "A" conducting strips—i.e., conducting strips 204A and 206A, and the "B" conducting strips—i.e., conducting strips 204B and 206B, are not shown. In one implementation, the interconnections are made by vertical vias (not shown) through the insulating layer between first layer 201 and second layer 203 of on-chip capacitor 200.

Figure 5:
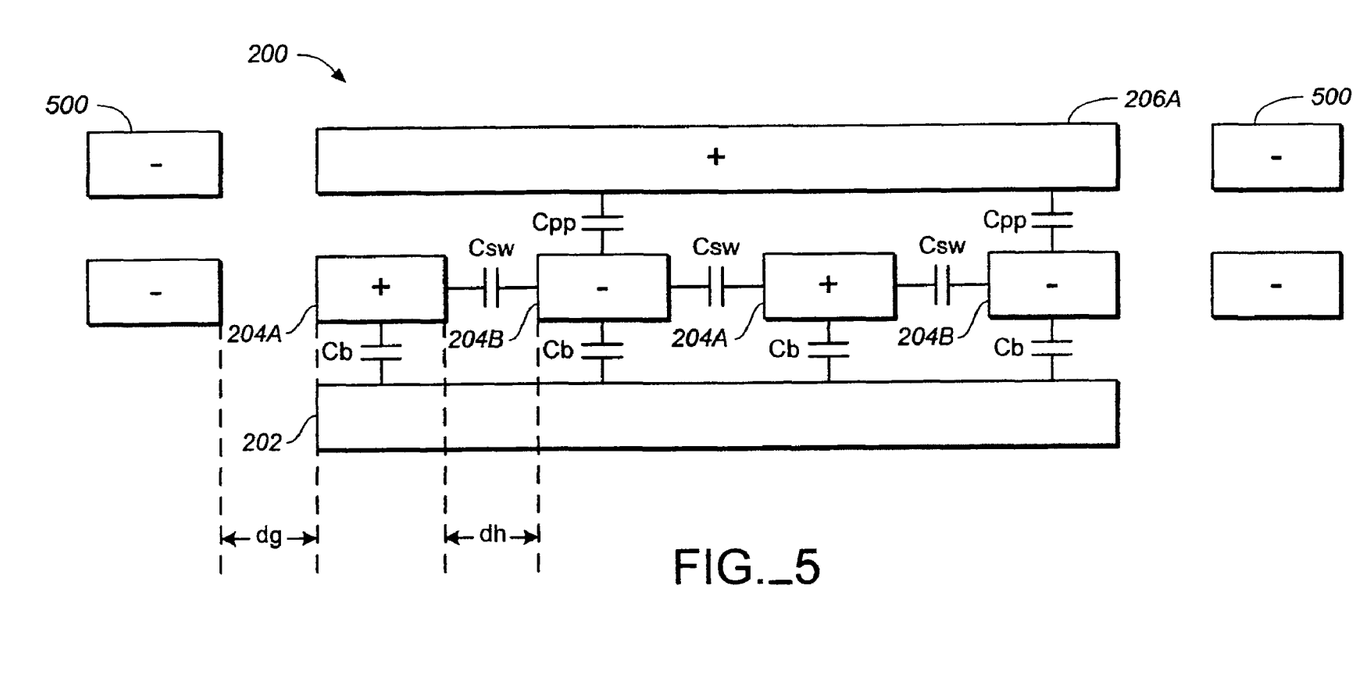
FIG. 5 is a side view of the on-chip capacitor structure of FIG. 2, including guard bands.

FIG. 5. shows a cross-section of one implementation of on-chip capacitor 200 (FIG. 2). As shown in FIG. 5, on-chip capacitor 200 includes a guardband 500 for attenuating coupling between on-chip capacitor 200 and external electromagnetic fields. Guardband 500 can be formed from a conductive material, for example, polysilicon, aluminum, and copper. In one implementation, guardband 500 is provided on each of first layer 201 and second layer 203 and substantially encircles the first and second common nodes of on-chip capacitor 200. Guardband 500 can encircle less than all of first layer 201 and second layer 203. Guardband 500 can only run along one side of on-chip capacitor 200. In addition, guardband 500 can be included on other layers either above or below first layer 201 and second layer 203 of on-chip capacitor 200. In one implementation, guardband 500 is spaced from the conducting strips a distance (dg) that is approximately twice the distance (dh) between adjacent conducting strips. Distance (dg) can be selected to minimize the parasitic fringing capacitance that is formed between guardband 500 and an adjacent conducting strip or base strip, while at the same time maintaining a volumetrically efficient on-chip capacitor 200.

In one implementation, to maintain a predetermined ratio between the capacitance of on-chip capacitor 200 and the parasitic capacitance formed from guardband 500, distance (dg) is increased when there are fewer conducting layers or conducting strips, and distance (dg) is decreased when there are more conducting layers or conducting strips. In one implementation, a line width of guardband 500 is selected to be the same as a line width of a conducting strip—e.g., conducting strip 206A or 206B. However, other line widths can be selected. In one implementation, guardband 500 is coupled through a low impedance (not shown) to a voltage potential such as ground. In one implementation, guardband 500 floats with respect to system voltage potentials.

Figure 6:
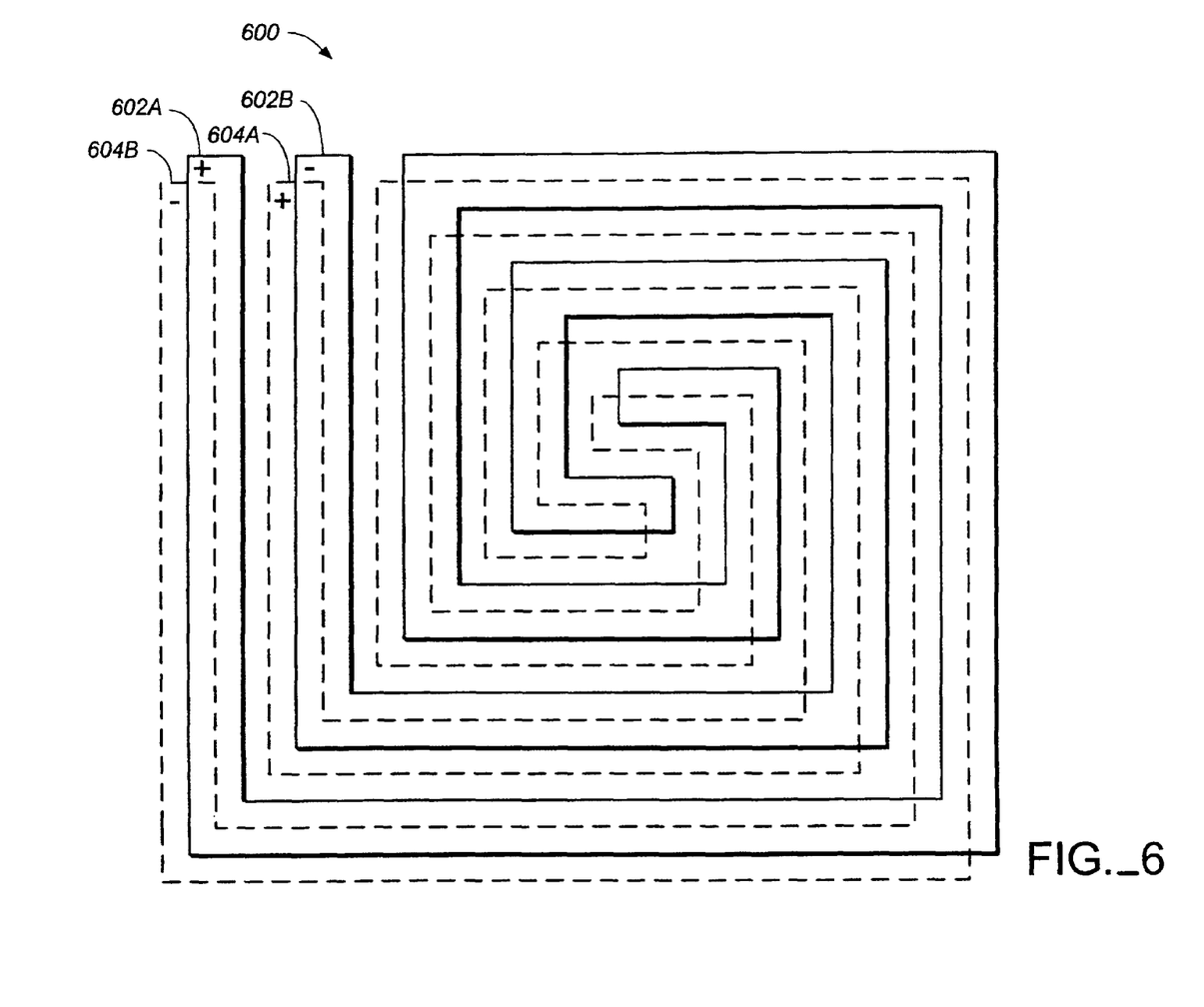
FIG. 6 is a top view of an on-chip capacitor structure.
Figure 10:
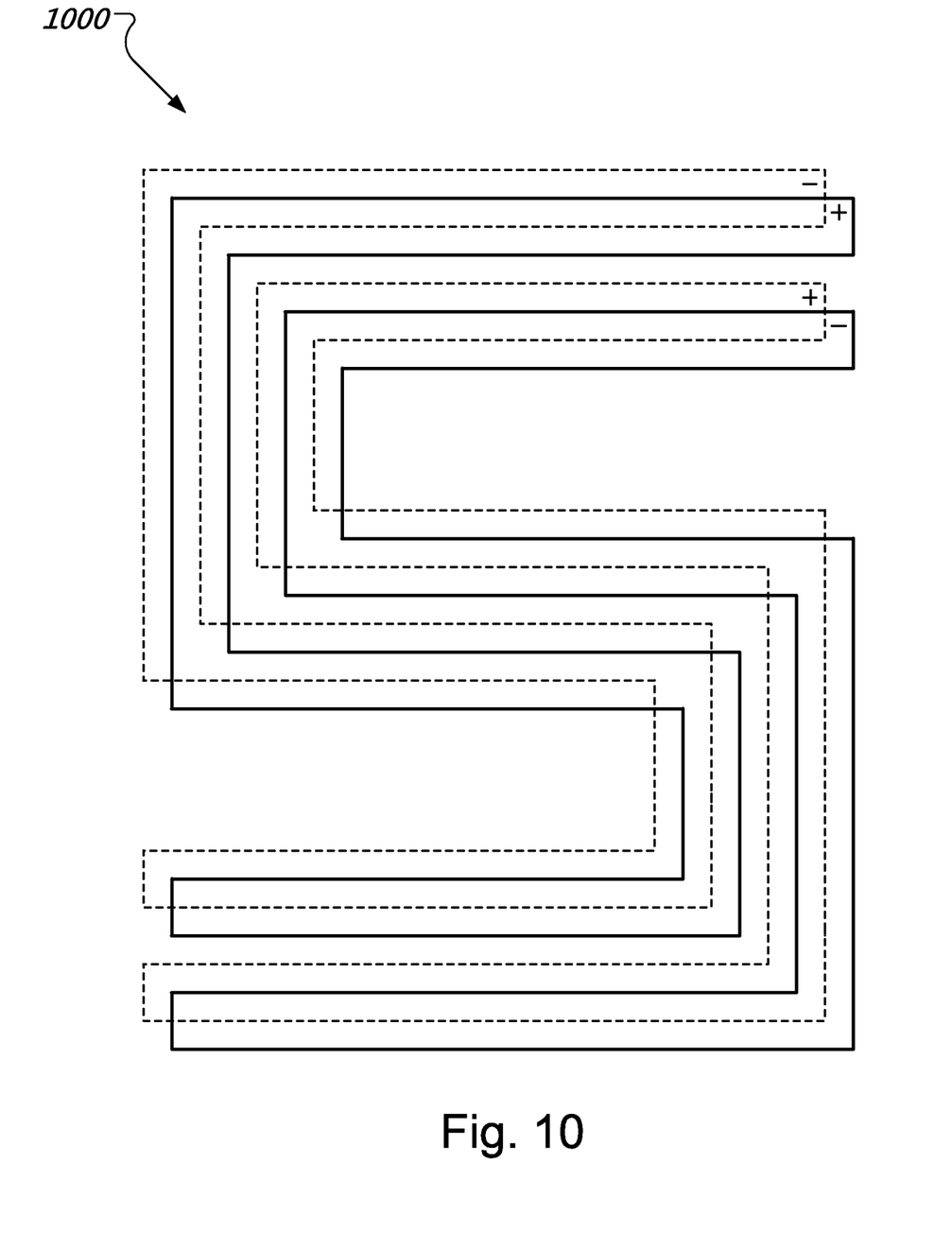
FIG. 10 is a top view of another on-chip capacitor structure.

FIG. 6 illustrates a top view of one implementation of a path configuration for an on-chip capacitor 600. On-chip capacitor 600 contains conducting strips that are laid out a path configuration that is substantially spiral. In particular, on-chip capacitor 600 includes lower layer conducting strips 602A and 602B and upper layer conducting strips 604A and 604B. Conducting strips 602A and 602B of the lower layer are shown in solid lines and conducting strips 604A and 604B of the upper layer are shown in dotted lines. Conducting strips 604A and 604B of the upper layer are displaced to distinguish the upper layer conducting strips 604A and 604B from the lower layer conducting strips 602A and 602B. In one implementation, conducting strips 604A and 604B respectively lie substantially directly over conducting strips 602B and 602A. Other path configurations can be implemented, e.g., L-shaped paths and S-shaped paths. For example, FIG. 10 illustrates a top view of one implementation of an S shaped path configuration for an on-chip capacitor 1000.

Figure 7A:
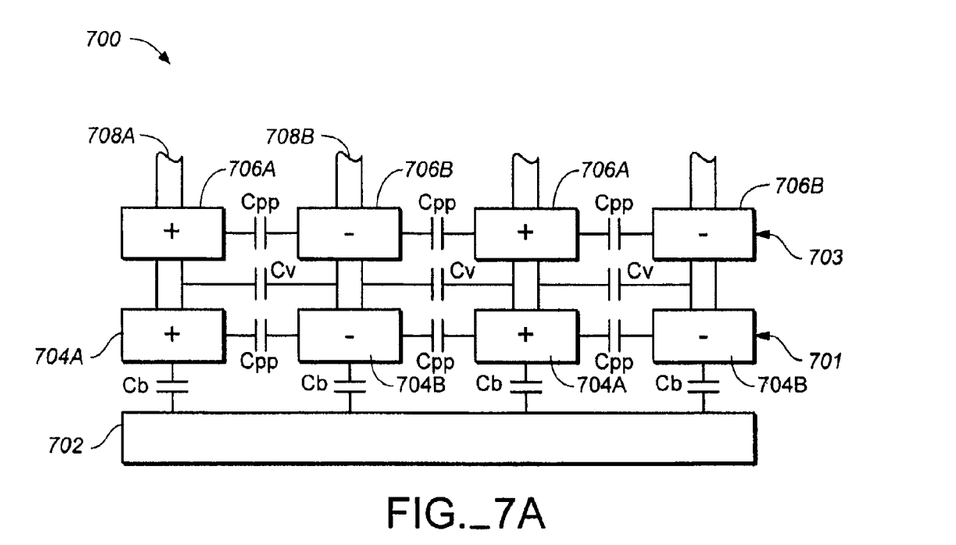
FIG. 7A is a side view of an on-chip capacitor structure, including vertical vias.

FIG. 7A. shows a cross-section B-B (FIG. 7B) of an on-chip capacitor 700. On-chip capacitor 700 includes two layers 701, 703 of conducting strips formed upon a substrate 702. A first layer 701 is formed by two sets of conducting strips 704A and 704B. Conducting strips 704A and 704B are arranged alternately and substantially in parallel to each other so that a conducting strip 704A is located next to a conducting strip 704B, as shown in FIG. 7B.

Figure 7B:
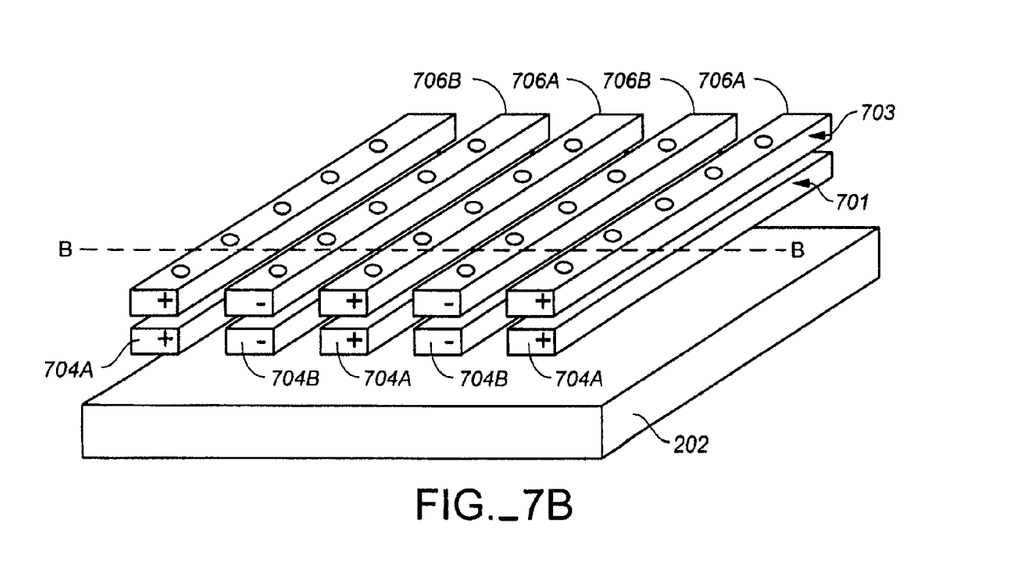
FIG. 7B is a perspective view of the on-chip capacitor structure of FIG. 7A.

Referring to FIGS. 7A and 7B, a second layer 703 is formed by two sets of conducting strips 706A and 706B. Conducting strips 706A and 706B are also arranged alternately and substantially in parallel to each other so that a conducting strip 706A is located next to a conducting strip 706B. Conducting strips 706A and 706B respectively overlie and are substantially parallel to conducting strips 704A and 704B, such that conducting strips of a same polarity overlie one another. For example, conducting strip 706A—shown as having a "+" polarity—substantially overlies conducting strip 704A—also shown as having a "+" polarity. On-chip capacitor 700 further includes vertical vias 708A that interconnect conducting strips 706A and 704A, and vertical vias 708B that interconnect conducting strips 706B and 704B.

A parallel plate capacitance (Cpp) is present between each adjacent pair of conducting strips (e.g., conducting strips 706A and 706B) within each layer. Furthermore, a via capacitance (Cv) is present between each adjacent pair of vertical vias (e.g., vertical vias 708A and 7083).

Figure 7C:
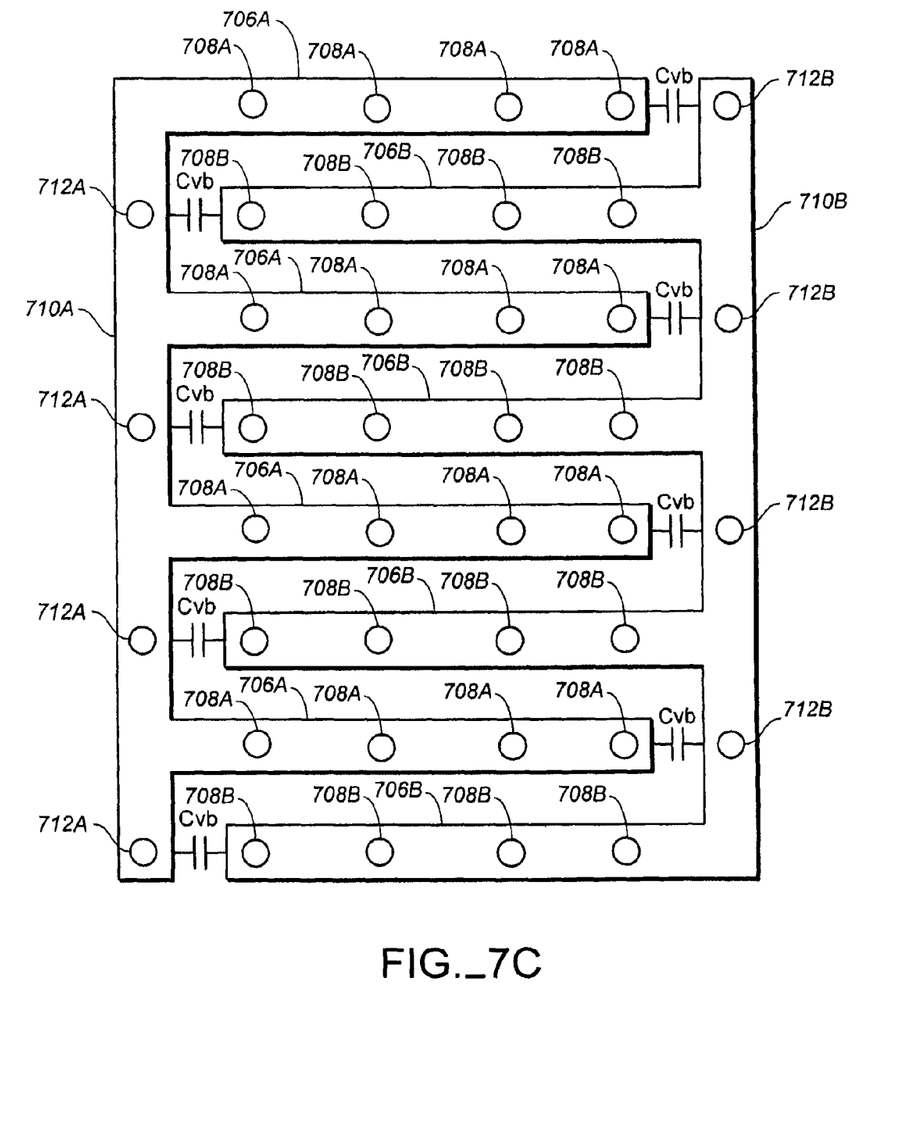
FIG. 7C is a top view of the on-chip capacitor structure of FIG. 7A.

FIG. 7C shows a top view of on-chip capacitor 700. In one implementation, conducting strips 706A are connected by a base strip 710A and conducting strips 706B are connected by a base strip 710B. Base strips 710A and 710B are located at opposing ends of conducting strips 706A and 706B so that conducting strips 706A and 7063 are interdigitated. In one implementation, base strips 710A and 710B are sized as wide as conducting strips 706A and 706B.

In one implementation, base strips 710A and 710B include vertical vias 712A and 712B, respectively. Vertical vias 712A and 712B interconnect with corresponding base strips (not shown) underlying base strips 710A and 710B. Vertical vias 712A can be placed along base strip 710A at locations substantially adjacent to one or more vertical vias 708B that are located on conducting strips 706B. Likewise, vertical vias 712B can be placed along base strip 710B at locations substantially adjacent to one or more vertical vias 708A that are located on conducting strips 706A.

In addition to the parallel plate capacitance (Cpp) (FIG. 7A), and the via capacitance (Cv) (FIG. 7A), a base strip via capacitance (Cvb) is present between each adjacent pair of base strip vertical via and conducting strip vertical via (e.g., vertical vias 712A and 708B).

Figure 8:
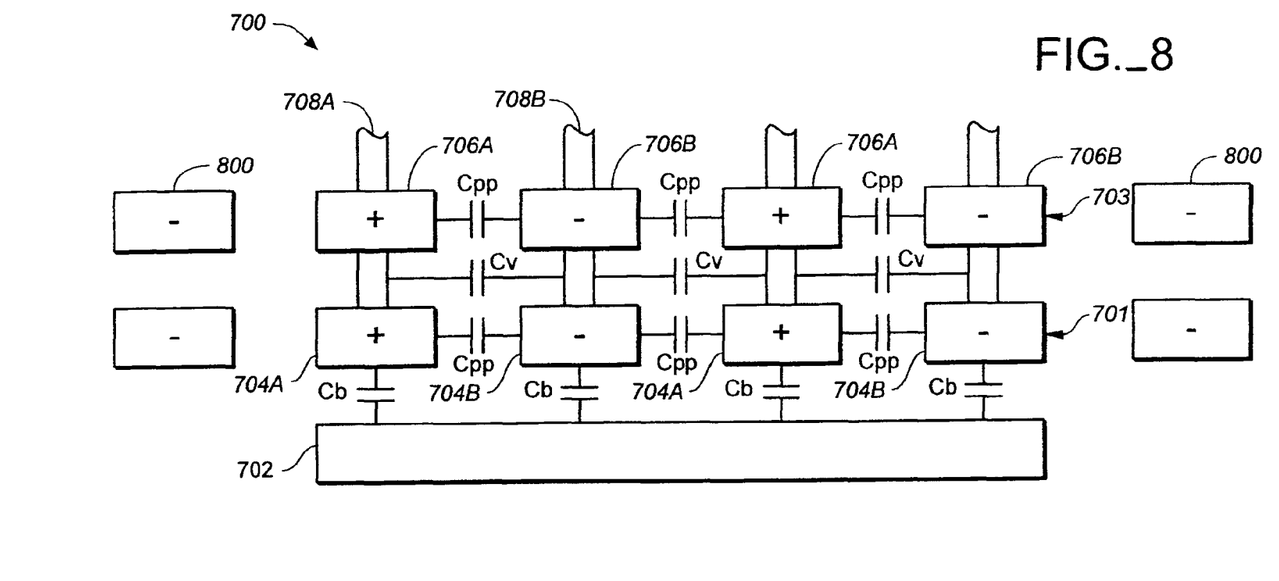
FIG. 8 is a side view of the on-chip capacitor structure of FIG. 7A, including guardbands.

FIG. 8. shows a cross-section of one implementation of on-chip capacitor 700 (FIG. 7A). As shown in FIG. 8, on-chip capacitor 700 includes a guardband 800 for attenuating coupling between on-chip capacitor 700 and external electromagnetic fields. In one implementation, guardband 800 is provided on each of first layer 701 and second layer 703 and substantially encircles the first and second common nodes of on-chip capacitor 700. Guardband 700 can encircle less than all of first layer 701 and second layer 703. Guardband 800 can only run along one side of on-chip capacitor 700. In addition, guardband 800 can be included on other layers either above or below first layer 701 and second layer 703 of on-chip capacitor 700.

Figure 9:
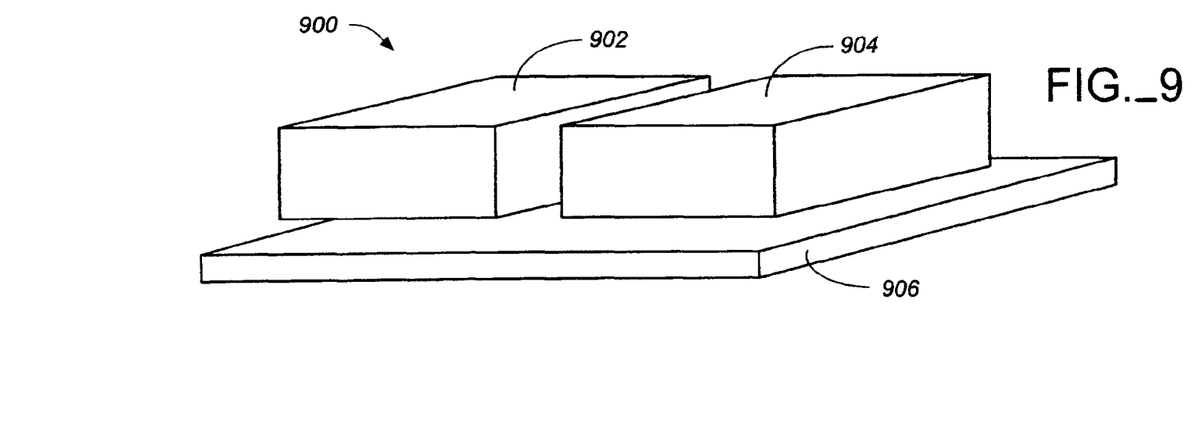
FIG. 9 is a perspective view of a split-capacitor configuration.

A number of implementations have been described. Nevertheless, various modifications to the implementations may be made. For example, an on-chip capacitor can be formed in a split-capacitor configuration 900 as shown in FIG. 9. Split-capacitor configuration 900 includes a first on-chip capacitor 902 and a second on-chip capacitor 904 formed upon a substrate 906. Each of first on-chip capacitor 902 and second on-chip capacitor 904 can have any one of the capacitor structures described in the implementations above. In addition, each of the capacitor structures described above can have any number of conducting layers, e.g. more than two layers. Accordingly, other implementations are within the scope of the following claims.

What is claimed is:

1. A method of producing capacitor structure comprising:
   arranging a first layer first polarity conducting strip and a first layer second polarity conducting strip on a first layer of an integrated circuit chip such that the first layer second polarity conducting strip is arranged adjacent to and spaced apart from the first layer first polarity conducting strip, and the first layer first polarity conducting strip and the first layer second polarity conducting strip are arranged as respective piecewise "S" shaped paths;
   arranging a second layer first polarity conducting strip and a second layer second polarity conducting strip on a second layer of the integrated circuit chip such that the second layer second polarity conducting strip is arranged adjacent to and spaced apart from the second layer first polarity conducting strip, the second layer first polarity conducting strip and the second layer second polarity conducting strip are arranged as respective piecewise "S" shaped paths, the second layer second polarity conducting strip is arranged overlying and electrically separated from the first layer first polarity conducting strip, and the second layer first polarity conducting strip is arranged overlying and electrically separated from the first layer second polarity conducting strip;
   electrically connecting the first layer first polarity conducting strip with the second layer first polarity conducting strip; and
   electrically connecting the first layer second polarity conducting strip with the second layer second polarity conducting strip.

2. The method of claim 1, wherein the arranging the first layer first polarity conducting strip and the first layer second polarity conducting strip on the first layer comprises arranging at least two first layer first polarity conducting strips and at least two first layer second polarity conducting strips on the first layer, and the arranging the second layer first polarity conducting strip and the second layer second polarity conducting strip on the second layer comprises arranging at least two second layer first polarity conducting strips and at least two second layer second polarity conducting strips.

3. The method of claim 1, further comprising arranging one or more guard bands on the integrated circuit chip.

4. The method of claim 1, further comprising:
   arranging a third layer first polarity conducting strip and a third layer second polarity conducting strip on a third layer of the integrated circuit chip such that the third layer second polarity conducting strip is arranged adjacent to and spaced apart from the third layer first polarity conducting strip, the third layer first polarity conducting strip and the third layer second polarity conducting strip are arranged as respective piecewise "S" shaped paths, the third layer second polarity conducting strip is arranged overlying and electrically separated from the second layer first polarity conducting strip, and the third layer first polarity conducting strip is arranged overlying and electrically separated from the second layer second polarity conducting strip;
   electrically connecting the third layer first polarity conducting strip with the second layer first polarity conducting strip; and
   electrically connecting the third layer second polarity conducting strip with the second layer second polarity conducting strip.

5. The method of claim 4, wherein the electrically connecting the first layer first polarity conducting strip with the second layer first polarity conducting strip and the electrically connecting the third layer first polarity conducting strip with the second layer first polarity conducting strip comprises forming a via, and wherein the electrically connecting the first layer second polarity conducting strip with the second layer second polarity conducting strip and the electrically connecting the third layer second polarity conducting strip with the second layer second polarity conducting strip comprises forming a via.

6. The method of claim 1, further comprising interposing a dielectric between the first layer and the second layer.

* * * * *